United States Patent [19]
Kalter et al.

[11] Patent Number: 5,796,662
[45] Date of Patent: Aug. 18, 1998

[54] INTEGRATED CIRCUIT CHIP WITH A WIDE I/O MEMORY ARRAY AND REDUNDANT DATA LINES

[75] Inventors: Howard Leo Kalter, Colchester; John Edward Barth, Jr., Williston, both of Vt.

[73] Assignee: International Business Machines Corporation, Armonk, N.Y.

[21] Appl. No.: 756,614

[22] Filed: Nov. 26, 1996

[51] Int. Cl.$^6$ ................................................. G11C 7/00
[52] U.S. Cl. ............................... 365/200; 365/189.08
[58] Field of Search .......................... 365/200, 189.08

[56] References Cited

U.S. PATENT DOCUMENTS

| | | | |
|---|---|---|---|
| 4,727,516 | 2/1988 | Yoshida et al. | 365/200 |
| 4,881,202 | 11/1989 | Tsujimoto et al. | 365/200 |
| 5,124,948 | 6/1992 | Takizawa et al. | 365/200 |
| 5,124,949 | 6/1992 | Morigami | 365/210 |
| 5,204,836 | 4/1993 | Reed | 365/200 |
| 5,299,164 | 3/1994 | Takeuchi et al. | 365/201 |
| 5,485,102 | 1/1996 | Cliff et al. | 326/10 |
| 5,490,119 | 2/1996 | Sakurai et al. | 365/230.08 |

OTHER PUBLICATIONS

"Method to Reconfigure Logic Signal Paths", IBM Technical Disclosure Bulletin, V. 29, #4, pp. 1575–1578, Sep. 1986.

Improved Bit Sparing Technique Yields Faster Memory Array Access: IBM Technical Bulletin, V. 33, #11, pp. 92–95, Apr. 1991.

"Bit Sparing Logic for Semiconductor Memory Systems" IBM Technical Disclosure Bulletin, V. 37, #06A, pp. 361, 362, Jun. 1994.

*Primary Examiner*—David C. Nelms
*Assistant Examiner*—Michael T. Tran
*Attorney, Agent, or Firm*—Whitham, Curtis & Whitham; H. Daniel Schnurmann

[57] ABSTRACT

An integrated circuit chip with RAM, a RAM macro or bit slice data logic and at least one spare array element or spare slice element and the redundancy scheme therefor. The chip includes a wide data path with a plurality of interchangeable elements such as bit slice elements or memory element and at least one more element than the number of bits in the wide data path; selection logic for deselecting defective data elements; and, switches for selectively coupling each bit of the wide I/O data path to one element or to an element adjacent the one element responsive to the selection means. The integrated circuit chip may further include drive means for selectively driving data from the switches to the element or, otherwise, passing data from the elements to the switches. The switches preferably are three-way switches, such as three CMOS pass gates.

13 Claims, 9 Drawing Sheets

| A0 | A1 | A2 | 0 | 1 | 2 | 3 |
|----|----|----|---|---|---|---|
| 0  | 0  | 0  | 0 | 0 | 0 | 0 |
| 1  | 0  | 0  | 1 | 0 | 0 | 0 |
| 0  | 1  | 0  | 1 | 1 | 0 | 0 |
| 1  | 1  | 0  | 1 | 1 | 1 | 0 |
| X  | X  | 1  | 1 | 1 | 1 | 1 |

INTEGRATED CIRCUIT CHIP WITH A WIDE I/O MEMORY ARRAY AND REDUNDANT DATA LINES

FIELD OF THE INVENTION

The present invention relates generally to integrated circuit chips with a wide data path and more particularly to semiconductor memories with redundant memory cells for replacing defective memory cells.

BACKGROUND OF THE INVENTION

Memory cell defects and memory array defects have many sources and, as a result, many signatures. While single, isolated cell failures may be spread throughout the array, very often, multiple cells in the same vicinity fail. When multi-cell failures occur, the failure may be characterized as a word line failure, (i.e. failing cells with the same word line address), a bit (or column) line failure (i.e. failing cells with the same bit address), or both. The sources of these multi-cell failures vary. In particular, bit line failures may be caused by one or more open bit lines, two or more shorted bit lines, missing field oxide, excess oxide, intercell leakage, or for various other reasons. Consequently, memory arrays are tested extensively to identify defective cells.

Very often, chips with defective cells can be repaired. Once identified, defective cells can be replaced, electrically, with spare cells, provided spare cells are included in the array. Providing on-chip spare cells to repair cell failures is known in the art as on-chip redundancy. A typical state of the art redundancy scheme has one or more spare rows (row redundancy) and/or one or more spare columns (column redundancy). These spare rows/columns have fuse programmable decoders that can be programmed to be responsive to the address of the defective row/column, while simultaneously disabling selection of the defective cell. Electrically, a repaired chip can not be discerned from a completely good chip.

In order to match a 32 or 64 bit or wide processor data path, Random Access Memories (RAMs) are being organized with wide data paths of 32 bits (×32) or wider. State of the art microprocessors typically employ a 32 bit or 64 bit data word. A computer system architectured around one of these microprocessors usually requires 4-8 MBytes (MB) of Dynamic RAM (DRAM). 8 MB of memory for such a system, organized by 2M by 32 can be made from four 16 Mb (2M×8) chips fairly simply. For example, a 2M by 32 Single In-line Memory Module (SIMM) would use 4 chips 2M by 8 in parallel. However, a 64 Mb chip organized 8M by 8 cannot be reconfigured so simply. Instead, a ×32 SIMM organization from an 8M by 8 requires additional complex logic at a substantial loss in performance. However, a wide I/O organization provides the optimum 64 Mb chip organization for use in a typical state of the art microprocessor based system, whether organized 2M by 32, 1M by 64 or 512K by 128. In fact, a 512k by 128 organization provides concurrent access to four 32 bit words simultaneously. Even as chip densities increase to 256 Mb and beyond, new wider word architectures, such as the Very Long Instruction Word (VLIW) architecture with instructions 256 bits wide or wider, are coming to the forefront. Further, RAM macros, designed to be included in a microprocessor or on an Application Specific Integrated Circuit (ASIC), are generally provided with a wide data bus that matches the on-chip data path, i.e., by 128 or by 256.

Unfortunately, prior art redundancy techniques are inadequate for wide I/O RAMs. There are several prior art approaches to providing column redundancy in RAM chips. In one prior art approach, spare columns are isolated in a small (redundant) array. Whenever the column address points to a defective column, a preprogrammed one of the spare columns is selected from the redundant array instead. See, for example, U.S. Pat. No. 4,727,516 entitled "Semiconductor Memory Device Having Redundancy Means" to Yoshida et al, incorporated herein by reference. However, Yoshida's approach is slow and requires a significant amount of extra logic. The extra logic is needed to determine whether the column address is pointing to a defective column and, if so, to bypass the defective column and select the preprogrammed spare column. A delay must be added to cell access time to allow the redundancy detect logic to determine whether the column address is pointing to a defective column and, if so, to select the correct spare column instead. While this redundancy approach was acceptable for single I/O chips, it is too slow, inflexible and cumbersome for use on wide I/O architecture.

Another redundancy approach is used when, as with denser arrays, the RAM array is organized hierarchically such that it is a group of smaller subarrays, e.g., the array might be divided into quadrants. In this second prior art redundancy approach, redundant columns are included with, and, dedicated to each subarray. Instead of substituting data from a separate subarray whenever a defective column is addressed, as in the first approach, a redundant column line within the subarray is selected.

FIG. 1 is a schematic representation of this second prior art redundancy scheme for a wide I/O, 16 Mb DRAM chip. The chip 100 is organized with two Redundant Bit Lines (RBL) 102 and 104 providing two spare columns in each subarray 106. Each subarray 106 includes $2^n$ Bit Lines (BL) 108 (where n is typically between 5 and 8) and redundant bit lines (2 in this example). Each of the subarrays 106 is part of a subarray block 110. All of the subarray blocks 110, collectively, form the entire RAM array. So, for example, a 16 Mb RAM has 16 blocks 110 of 1 Mb each. Block size, subarray size and the number of subarrays 106 per block 110 are interdependent and, selected based on performance and logic objectives.

This second prior art redundancy approach is not as slow as the first, but it is also not as flexible either. With the first prior art approach, any spare column in the block of redundant columns could be substituted for any defective column. With this second prior art approach, defective columns can only be replaced by spare columns in the same subarray. So, there must be at least one spare column for each subarray just to insure full chip coverage. Although the coverage afforded by this second approach may provide for replacing more than two defective columns, i.e. in different subarrays, two spare columns per subarray 106 only guarantees that two defective columns per chip are repairable. Three defective columns in the same subarray 106 is unrepairable.

Furthermore, in addition to being inflexible, this second approach does not eliminate the redundancy related timing delay. A subarray 106 is accessed when one word line 112 is selected and driven high. Data from accessed cells are provided simultaneously to the bit lines 108 and redundant bit lines 102 and 104. After a predetermined minimum delay, sufficient to allow the redundancy decoder to determine whether a spare column is addressed, a single bit line 108 or a redundant bit line 102, 104 is selected in each subarray 106. In each subarray, the selected bit line 108 or redundant bit line 102, 104 is coupled to a Local Data Line (LDL) 114. LDLs 114 are coupled to Master Data Lines (MDLs) 116. The MDLs 116 couple corresponding subarrays 106 in each subarray block 110. Data is transferred between the subarrays 106 and the chip I/O's on the MDLs 116.

Normally, bit select logic is faster than redundancy decode logic. However, even if both circuits were equally fast, with this second approach, bit line selection would have to be delayed to avoid timing conflicts known as race conditions. When a race condition occurs, the spare bit line 102 or 104 and the defective bit line are, for a short period, both connected to the LDL simultaneously and, thereby, shorted together. Problems from race conditions vary from slowing data (i.e. sensing whether a "1" or "0" was stored), to inadvertently switching data stored in the array or causing wrong data to be read or written. To avoid race conditions, prior to bit line selection, a slight delay must be added to the chip timing. While significantly smaller than the delay required using the first prior art approach, this slight delay still requires intentionally slowing chip access time to include redundancy. Slowing chip access is counter to the high performance objectives for most RAMs.

Besides being inflexible and slowing chip access, this second prior art redundancy scheme is inefficient. In the 16 Mb chip of the example above, for every $2^5=32$ bit lines 108, there are two redundant bit lines 102 and 104. At least 6.25% of the array area is dedicated to spare cells.

Prior art redundancy schemes for wide I/O array chips are extensions of the above-described prior art schemes. These prior art redundancy schemes, which had limited advantages for narrow I/O RAMs, are inadequate for wide I/O RAMs or for prefetch type SDRAMs. As noted above, a wide I/O chip organization becomes even more necessary as RAM density increases. Thus, there is a need for a wide I/O RAM architecture with flexible redundancy.

PURPOSES OF THE INVENTION

It is a purpose of the present invention to simplify bit line sparing.

It is another purpose of the present invention to improve RAM yield.

It is yet another purpose of the present invention to reduce RAM redundancy overhead.

It is yet another purpose of the present invention to simplify bit line sparing while reducing RAM redundancy overhead.

SUMMARY OF THE INVENTION

The present invention is an integrated circuit chip with a RAM or a RAM macro with at least one spare array element and the decode and redundancy scheme therefor. The chip is organized such that it has a data path with a plurality of interchangeable parallel memory elements, at least one more memory element than the width of the I/O path. It includes selection means for deselecting defective memory elements in the data path. Switches selectively couple each bit of the I/O path to one memory element or to an adjacent memory element responsive to the selection means. The integrated circuit chip may further include drive means for selectively driving data from the switches to the data path or otherwise passing data from the data path to the switches. The switches are, preferably, three-way switches. Preferably, each of the three-way switches is a three CMOS pass gate.

DETAILED DESCRIPTION OF THE PREFERRED EMBODIMENT

Figure 1:
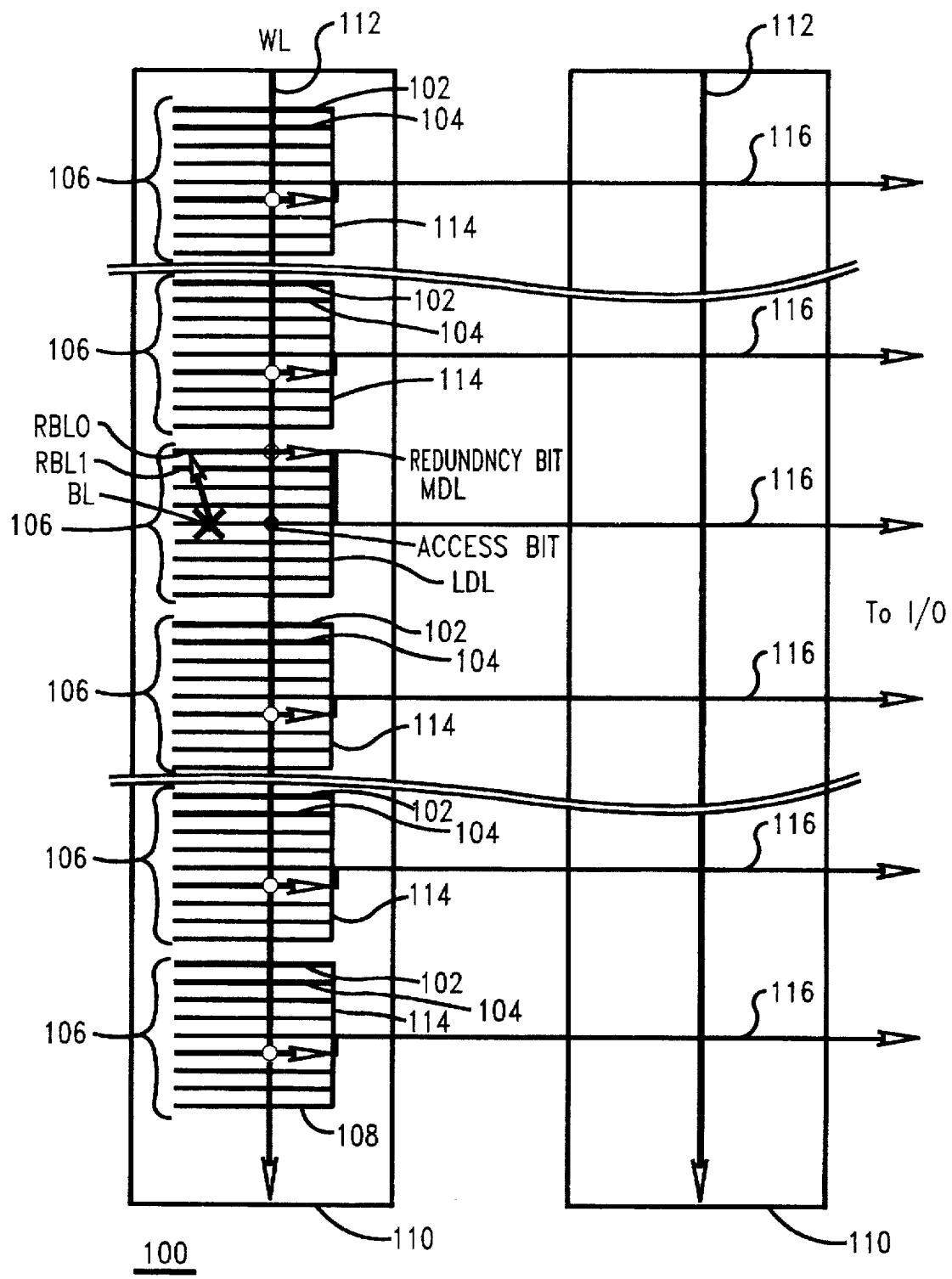
FIG. 1 is a schematic representation of a prior art redundancy scheme for a wide I/O RAM.

The present invention is an integrated circuit chip with a RAM, or RAM macro or bit slice data logic with spare RAM cells or with spare bit slices and the redundancy scheme therefore. In a present invention chip, defective elements are logically ignored and replaced with an adjacent identical good element, effectively shifting the adjacent element one position into the failing element's former position. Further, all elements to one side of a defective element are shifted one position in the same direction. Although the present invention is described generally in terms of wide I/O RAM or DRAM redundancy, it is understood that the present invention may be adapted for the data path of any logic block having a modular or bit slice organization.

Memory arrays may be organized into identical blocks (referred to herein as columns) that all provide the same function and are, thus, interchangeable. The present invention takes advantage of this interchangeable property of RAM columns. Typically, prior art RAM arrays have a fixed bit position that is maintained throughout the data path. While redundant bit lines may be included in these prior art chips, to replace defective bits in the data path redundant bit lines are reloaded to replace a failing bit line only if and when they were identified as defective. However, these prior art sparing techniques slow chip performance. All that is necessary is that data read from a RAM matches the data written to it. However, in prior art RAMs, each individual bit was (by design) permanently assigned to a location in a word or data path. That bit assignment was unchanged unless it was identified as defective. Then, the identified defective bit or location was electrically replaced (through fuse programming) by separate individual spare bit lines or column lines, predesignated as spares bit lines or redundant column lines. This type of sparing required special decode and decode timing logic that may become very complicated. See, "Bit sparing logic for semiconductor memory systems" IBM Technical Disclosure Bulletin, Vol. 37, No. 6A, pp. 361–362, June, 1994, for an example of a memory with spare cells wherein "all bits at address locations equal to or higher than (a) bad bit (are directed) to the next location in memory."

The present invention maintains bit order even after replacing defective elements with spare elements. Bit locations are not fixed within the data path and, therefore, the present invention is significantly faster than prior art approaches and, requires very little extra logic and no timing logic. In the present invention, a defective element is ignored, logically, by shifting data path inputs and outputs one position to one side of the defective element.

In IBM TDB Vol. 33, No. 11, April 1991, pp. 92-96, entitled "Improved Bit Sparing Technique Yields Faster Memory Access", by Norgaad, a large computing system memory array is provided with spare memory modules that replace defective modules by shifting data path bits one position and ignoring the defective modules. This is a system memory wherein "the (memory) control register is loaded (by a processor) with a value that corresponds to the failing memory module . . . " However, selectively shifting data bits in a memory system under program control of a processor is a relatively trivial task, in particular, when 10% of the memory is dedicated to redundancy as is disclosed herein. Shifting part of a data word from a RAM or RAM macro on an integrated circuit chip without seriously slowing RAM performance is much more difficult. A straight forward shift control generation such as something analogous to a ripple carry, would effectively shift part of the word. However, the delay from a ripple carry shift would be position dependent and in most cases, prohibitively long. Therefore, a bit shift redundancy scheme has not been practical for use on a data path on an integrated circuit. However, the shift decode of the present invention RAM is fast enough that 1, 2 or all of the bits in the data path may be shifted 1 bit, 2 bits or as many as desired without slowing RAM performance. A present invention RAM or RAM macro is much more flexible than prior art RAMs. Further, the present invention may be applied to an integrated circuit chip with wide I/O, fixed-function logic data paths such as bit slice elements, as well as memories. Generally, with only a few exceptions for programmable array logic, redundancy was not available in prior art logic chips. See, U.S. Pat. No. 5,485,102, entitled "Programmable Logic Devices with Spare Circuits for Replacement of Defects" to Cliff et al., for example, of including spare logic cells on a Programmable Array Logic (PAL). When one PAL product term path is identified as containing defective cells, adjacent product term logic cells are programmed to replace the failing product term logic, while maintaining chip I/O assignment. However, PALs are fully programmable, low density, low function logic chips that have no predetermined function until programmed.

Figure 2:
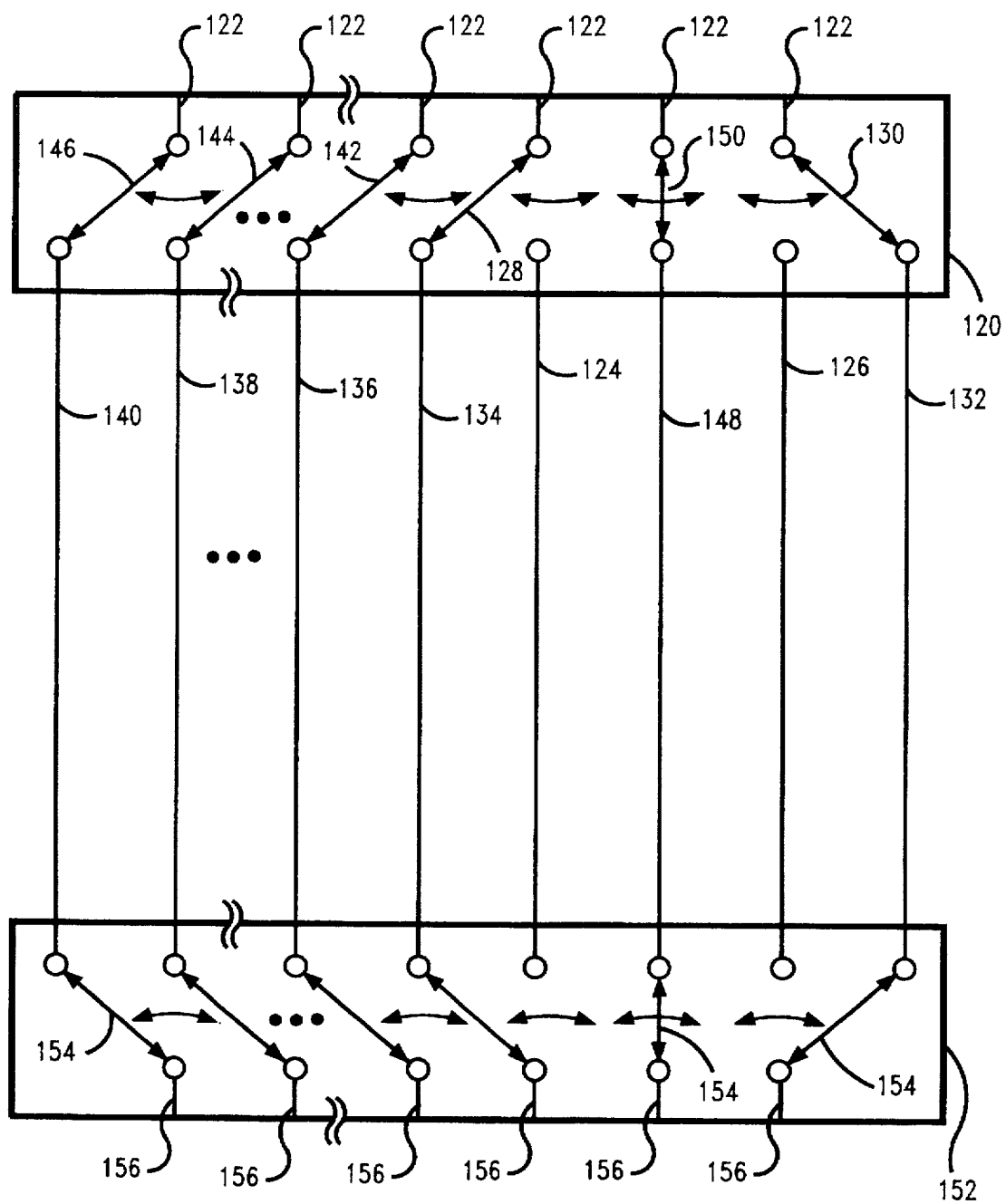
FIG. 2 is a block diagram of a bit slice data such as in a RAM array path with spare data elements for repairing identified defective elements according to the present invention.

FIG. 2 is a logic block diagram of a chip having a wide I/O bit slice data path such as in an accumulator, an adder, a stack register or a RAM, according to the present invention. Input block 120 receives a 128 bit input word on input pins 122. Two defective slices, represented by lines 124 and 126 have been identified and, so, are ignored by switching them out of the data path on switches 128, 130, respectively. One or more data lines 132 to the right of defective slice 126 are shifted one position to the right by switch 130. Data lines 134, 136, 138 and 140 to the left of defective slice 124 are shifted one position to the left by switches 128, 142, 144 and 146. One or more data lines 148 between defective slices 124, 126 remain unshifted by switch 150. Good data lines 132–140 and 148 emerging from the data path are switched back into position in output block 152 by switches 154 to emerge as a 128 bit word on output pins 156. Typically, for a RAM, input block 120 and output block 152 would be the same block. So, the term pin is used, instead of input or output, to indicate that the point may serve as either an input or an output, interchangeably.

Figures 3A, 3B:
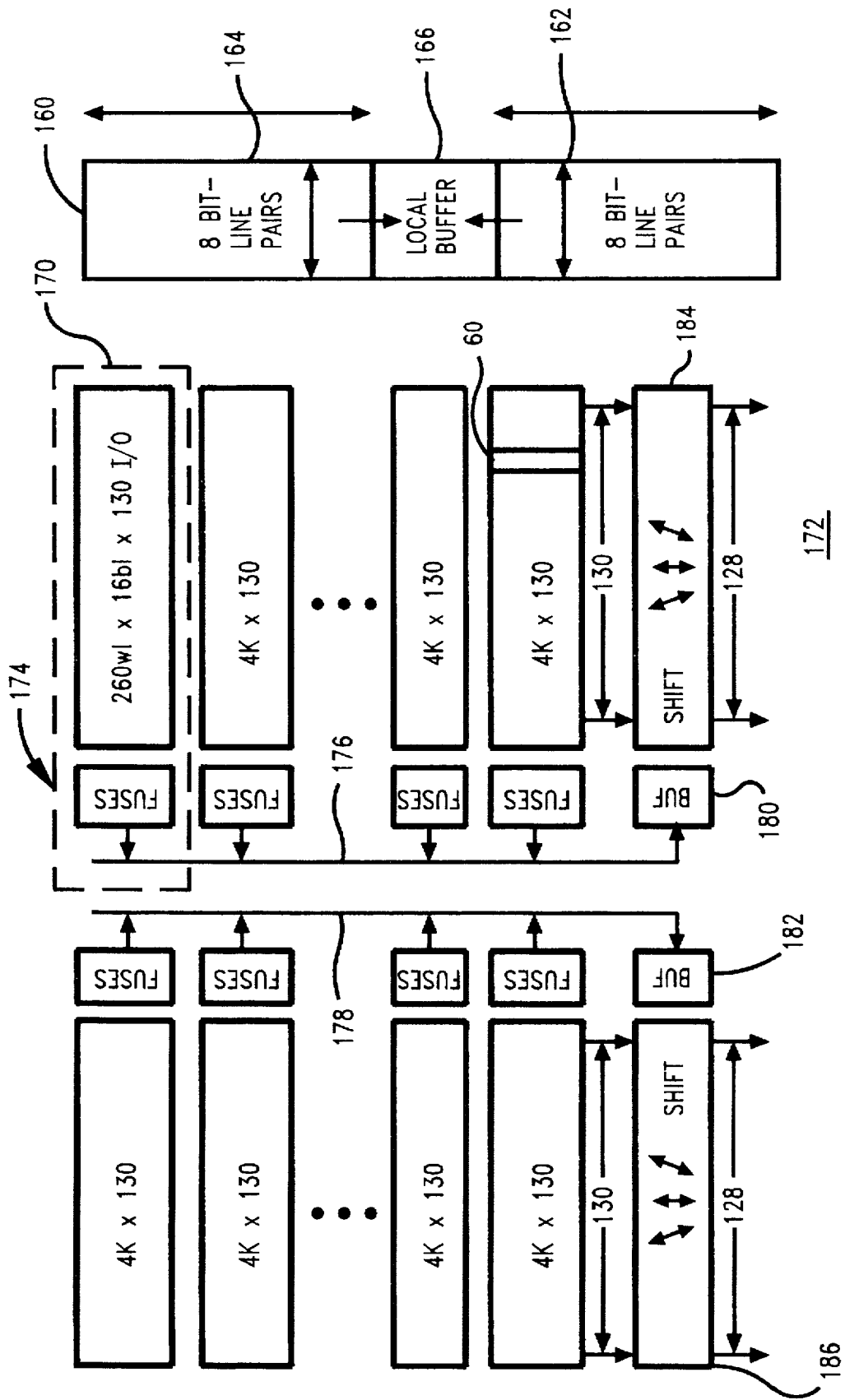
FIG. 3A is a wide I/O DRAM with spare columns for repairing defective columns according to the present invention.
FIG. 3B is a block diagram of a column that is a replaceable element for the wide I/O DRAM of FIG. 3A.

FIG. 3A is an example of block diagram of a preferred embodiment wide I/O DRAM. FIG. 3B is a block diagram of a replaceable array element 160 or column, organized 256 word lines by 16 column lines. The 16 column lines are divided into two groups 162, 164 of 260 word lines (including 4 spare word lines) by 8 bit line pairs (columns) each. The two groups are located on opposite sides of a local buffer 166. Each bit line pair (or column line) includes a sense amp (not shown) for reading array data. A column address provided to a column decode (not shown) selectively couples one sense amp output to the local buffer, which redrives the selected sense amp output on an LDL that is passed to an MDL. Each array block 170 of the wide I/O DRAM 172 of FIG. 3A includes 130 identical such replaceable array elements 160, i.e., 128 data and two spare elements 160.

In addition, each array block 170 includes a block of fuse elements 174, where fusible links are located for programming redundancy decoders and for programming bit shift selection. When a particular block 170 is selected, bit shift selection signals from that fuse block 174 are passed on buses 176, 178 to buffers 180, 182. Buffers 180, 182 in turn, redrive and pass control signals to shift block 184, 186 which selects MDL lines that are shifted to the right or left. As indicated above, shift blocks 184, 186 include both input block 120 and output block 152. For the preferred embodiment DRAM of FIG. 3A, switches in shift blocks 184, 186 are pass gate switches.

Figure 4:
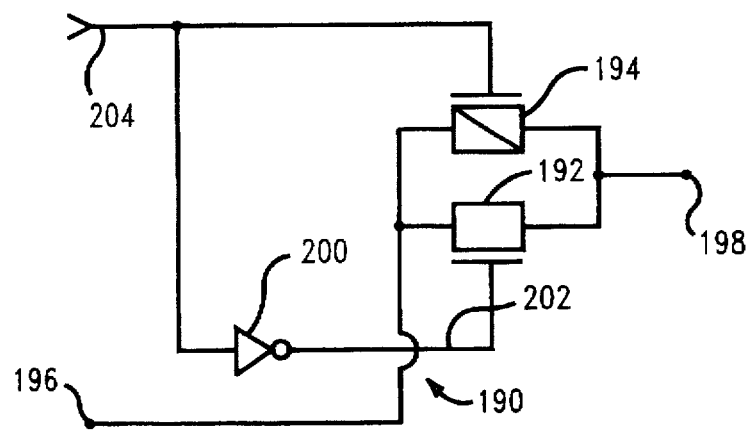
FIG. 4 is a schematic of a CMOS pass gate.

FIG. 4 is a schematic of a simple CMOS pass gate 190 that is an NFET 192 and a PFET 194 in parallel between two interchangeable pins 196 and 198. An inverter 200, or other equivalent logic, is connected between the gates 202, 204 of the two devices. The inverter 200 insures that the gate 202 of NFET 192 is always inverted from the gate 204 of PFET 194, so that both FETs 192, 194 are either on or off, simultaneously. Thus, either with 204 low both devices 192, 194 are on (i.e., the switch is closed) or with 204 high both are off (i.e., the switch is open). Three of these CMOS pass gates 190 are combined to form a three-way switch.

Figure 5:
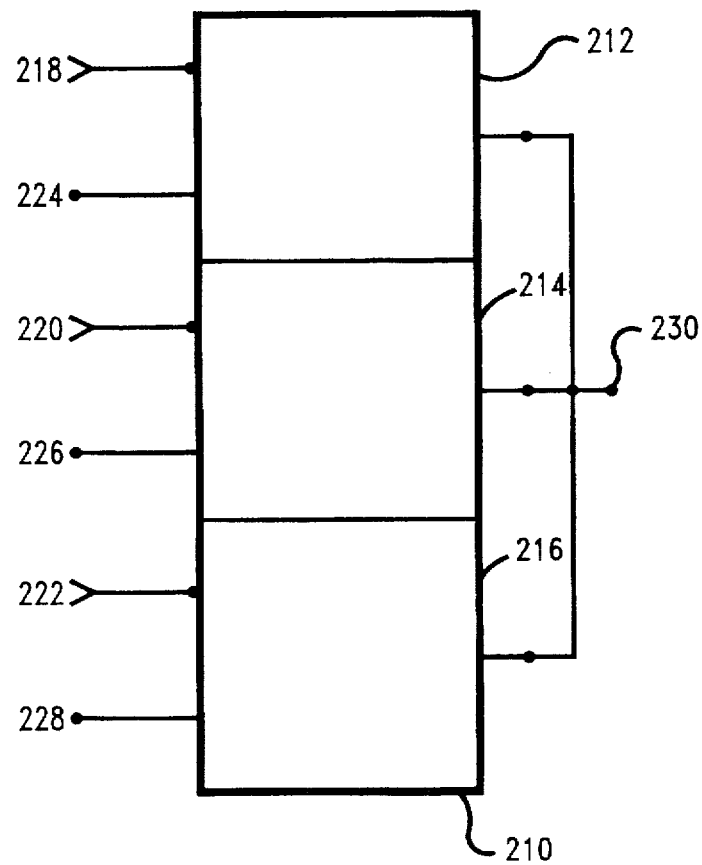
FIG. 5 is a three-way switch block diagram using CMOS pass gate as in FIG. 4.

FIG. 5 is a schematic of a three-way switch 210 from three CMOS pass gates 190. The switch includes three CMOS pass gates 212, 214, 216 that are each identical to CMOS pass gate 190 in FIG. 4. Each switch select input 218, 220 and 222 is an input to inverter 200 in one pass gate block 212, 214 or 216 respectively. Pins 224, 226 and 228 correspond to one conductive terminal, either 198 or 196 of NFET/PFET pair 192, 194 for each pass gate 212, 214 and 216, respectively. The three remaining pass gate conducting terminals 196 or 198 are connected in common at pin 230. Selection is by driving one of 218, 220 or 222 low. Thus, by selecting one pass gate 212, 214 or 216 and leaving the other two unselected, data is passed from one of 224, 226 or 228 to 230 or from 230 to one of 224, 226 or 228. If none of the gates 212, 214 or 216 are selected, nothing is passed and the three-way switch 210 is off.

Input block 120, output block 152 and shift blocks 184, 186 each include 128 of these three-way switches 210. Three adjacent bits (n, n+1 and n+2) are connected to each of pins 224, 226 and 228, respectively. Data may be blocked (i.e. the line switched out) by not selecting any pass gate in the three-way switch 210. Otherwise, pass gate 212 is selected when no shift is done, providing bit n at 230; pass gate 214 is selected when a 1 bit shift is done, providing bit n+1 at 230; and, pass gate 216 is selected when a two bit shift is done providing bit n+2 at 230. Each switch element 212, 214, 216 receives an individual one of three select signals that determine whether the data to/from the element is: passed unshifted; blocked; or shifter right or left. Since shifting is independent of column address, the select signals may be provided to the switch well before data reaches the switches. Thus, there is no timing delay, which is normally required to allow column redundancy decode.

Alternatively, the unshifted array may be considered to have the unshifted data path at one array side (i.e., the right or left) with spare elements considered to be at the other side (i.e., the beginning or end of the word). The initially, unshifted configuration is not critical, except in determining how shift logic generates enable signals. In this alternative embodiment, the three signals would determine whether data to/from the element is passed unshifted; blocked; shifted one element; or shifted two elements.

Figure 6:
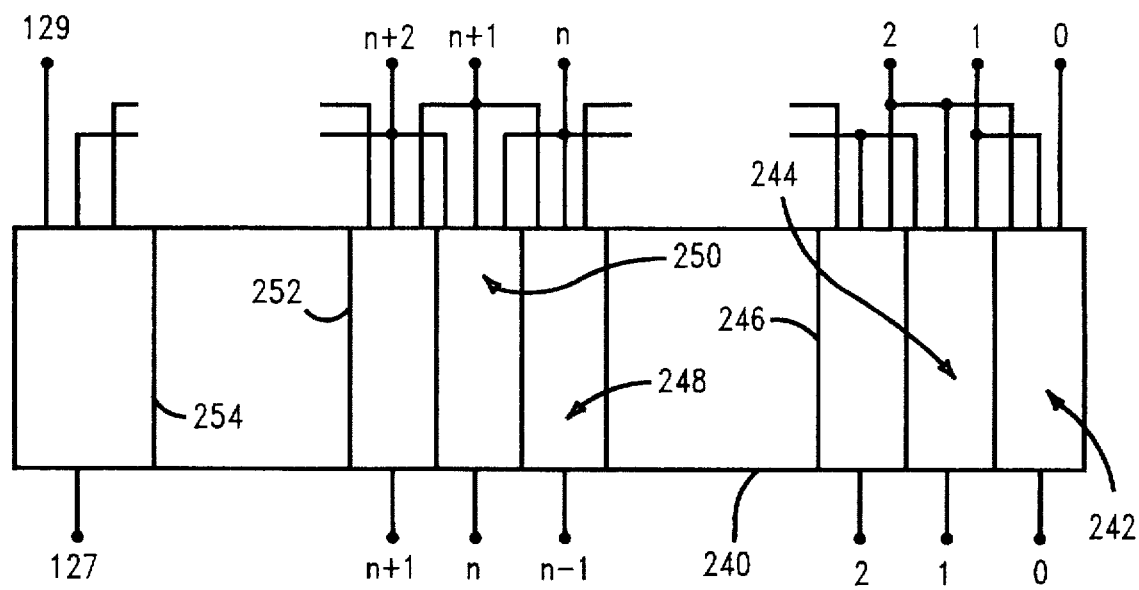
FIG. 6 is a wide I/O switch block as used in the DRAM of FIG. 3A, wherein the switches are three-way switches of FIG. 5.

FIG. 6 is a block diagram of a 128 bit shift block 240, as in shift blocks 184 and 186, including 128 of the three-way switches 210 of FIG. 5. In the shift block 240, pins 224, 226 and 228 of each of 128 identical switches 242–254 are connected to allow selectively shifting each of the 130 data lines 0, 1 or 2 positions, and also to allow ignoring any two selected data lines. Thus, select control signals are provided to each individual switch 242–254 at the switches' control inputs 218, 220 and 222 in FIG. 5 (not shown in FIG. 6). In this embodiment, shift selection for each switch 242–254 is programmed in fusible links in each fuse block 174. So, bit shifting is block dependent and not fixed for the entire DRAM.

Figure 7:
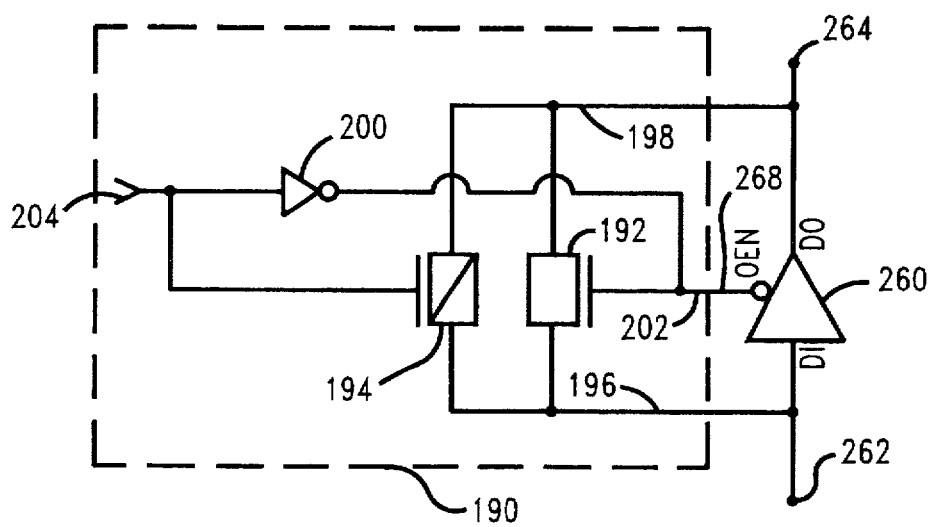
FIG. 7 is a schematic of a bidirectional buffer for redriving external data from the switches to the data lines of the DRAM of FIG. 3A.

FIG. 7 is an optional bidirectional buffer that is required in the preferred embodiment DRAM because for the array, the data path is bidirectional, but, encountered loads are not. Therefore, data to the array blocks 170 may be buffered and redriven. The bidirectional buffer of FIG. 7 is a pass gate such as CMOS pass gate 190 in FIG. 4, that is tied in parallel to a tri-state driver 260. The tri-state driver's data input 262 is tied in common to one side of the pass gate and the pass gate's opposite side is tied in common to driver's output 264. The tri-state enable 268 for the driver 260 is inverted from the pass gate enable 204, guaranteeing that either the pass gate 190 or the driver 260 is enabled, but not both simultaneously. For the DRAM of FIG. 3A, one bidirectional buffer is located at each of the 130 switches 242–254. Each driver input 262 is connected to a switch and the driver's output is connected to an array MDL. Thus, when data is being read from a block, the pass gate is enabled and the driver 260 is disabled (placed in its high impedance state), with enable line 268 high and pass gate control line 204 low. When data is passed back to an array block, i.e., written to the array, pass gate enable line 204 is high and all of the pass gates are disabled while all of the driver enable lines 268 are low so that all of the drivers 260 are enabled.

Figure 8:
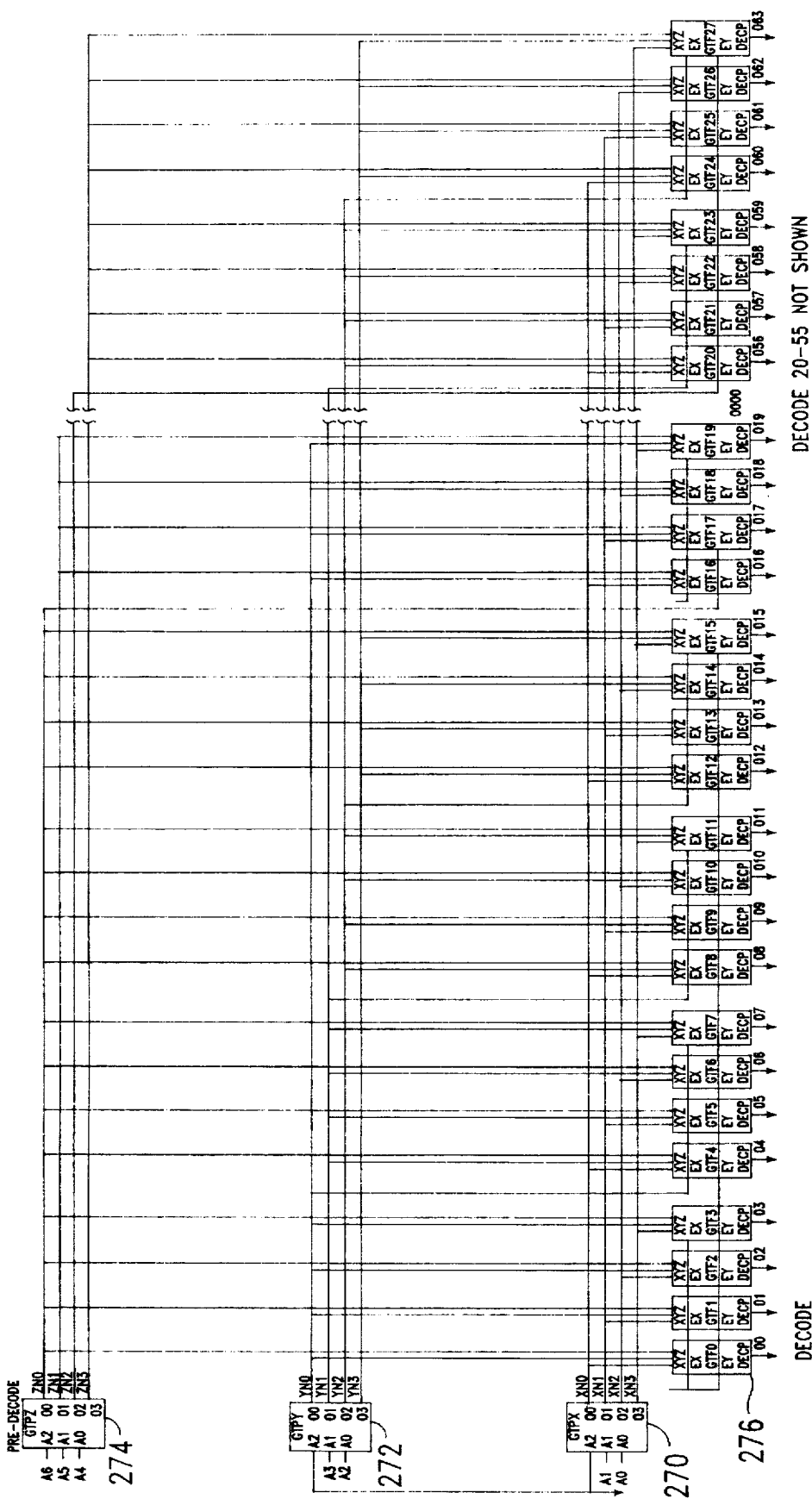
FIG. 8 is a block diagram of a shift select circuit for a present invention integrated circuit chip.

FIG. 8 is a block diagram of a 64 bit shift select circuit for a present invention RAM. Seven decode address (A0–A6) are encoded using fusible links to select the location of the defective column. X, Y and Z predecoders 270, 272 and 274 partially decode the encoded bit location, decoded bit information is passed from the X, Y and Z pre-decoders 270, 272 and 274 on XN0–XN3, YN0–YN3 and ZN0–ZN3, respectively, to final decoders 276. XN0–XN3, YN0–YN3 and ZN0–ZN3 are negative active signals. For convenience, final decoders 276 are distinguished herein by reference to their outputs. Thus, the final decoder having output 00 is referenced herein 27600, the final decoder 276 having output 07 is referenced herein 27607, and the final decoder having output 063 is referenced herein 276063.

Figures 9A, 9B:
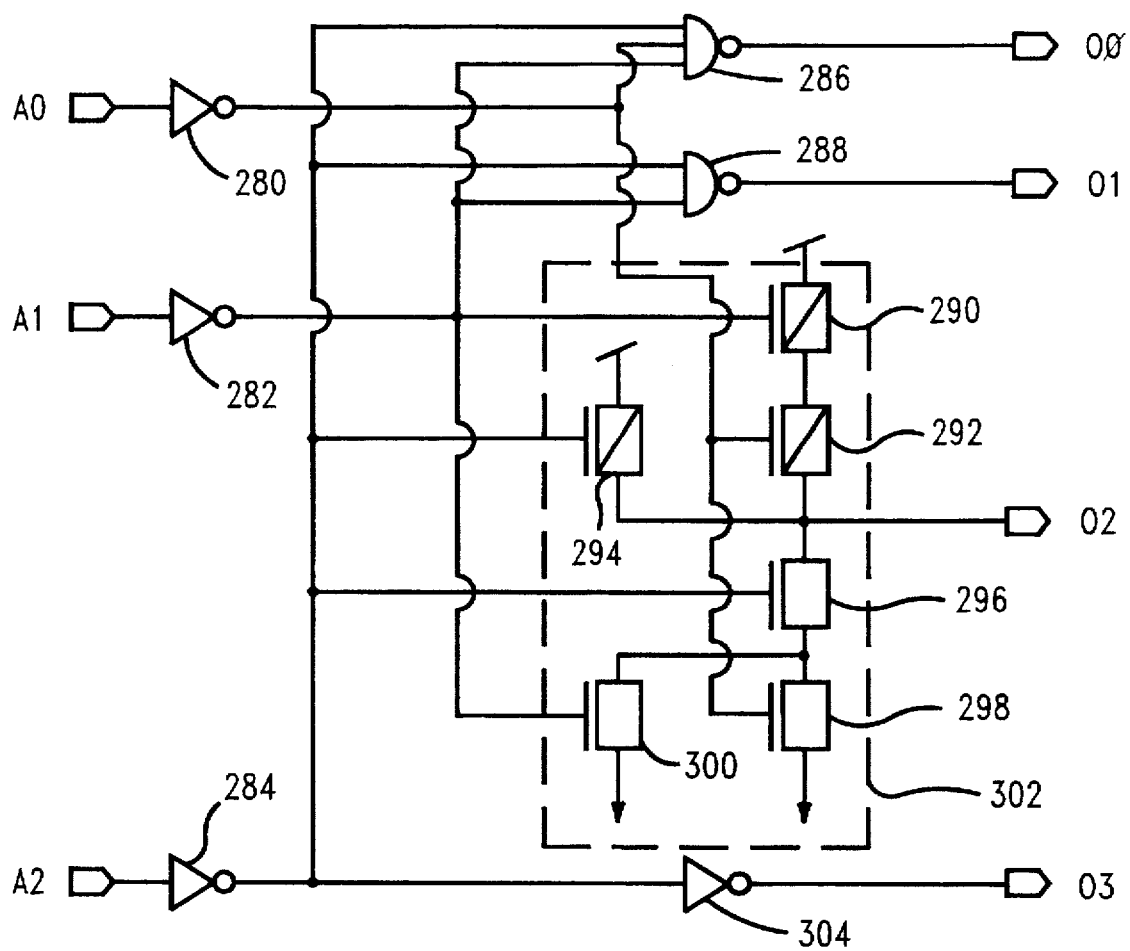
FIG. 9A is a schematic of a pre-decoder for the shift select circuit of FIG. 8.
FIG. 9B is a truth table for the pre-decoder of FIG. 9A.

FIG. 9A is a schematic representation of a pre-decoder as in X, Y and Z pre-decoder 270, 272 or 274. FIG. 9B is a truth table for the pre-decoder. Each input A0, A1 and A2 is buffered by an inverter 280, 282 and 284 respectively. Three-way NAND gate 286 combines $\overline{A0}$, $\overline{A1}$ and $\overline{A2}$ from inverters 280, 282 and 284 to provide output O0 which is low (asserted) only if all three inputs A0, A1 and A2 are low. Two-way NAND gate 288 combines $\overline{A1}$ and $\overline{A2}$ from inverters 282 and 284 to provide output 01, which is low when both A1 and A2 are low regardless of the state of A0. PFETs 290, 292, 294 and NFETs 296, 298 and 300 form an AND-OR-Invert (AOI) 302. AOI 302 combines $\overline{A0}$, $\overline{A1}$ and $\overline{A2}$ from inverters 280, 282 and 284 providing the logical function $\overline{A2}$ ($\overline{A0}+\overline{A1}$) at 02. Thus 02 is low if A2 is low and either A0 or A1 is low. Inverter 304 reinverts $\overline{A2}$ providing 03=A2. So, 03 is low only if A2 is low.

Figure 10A:
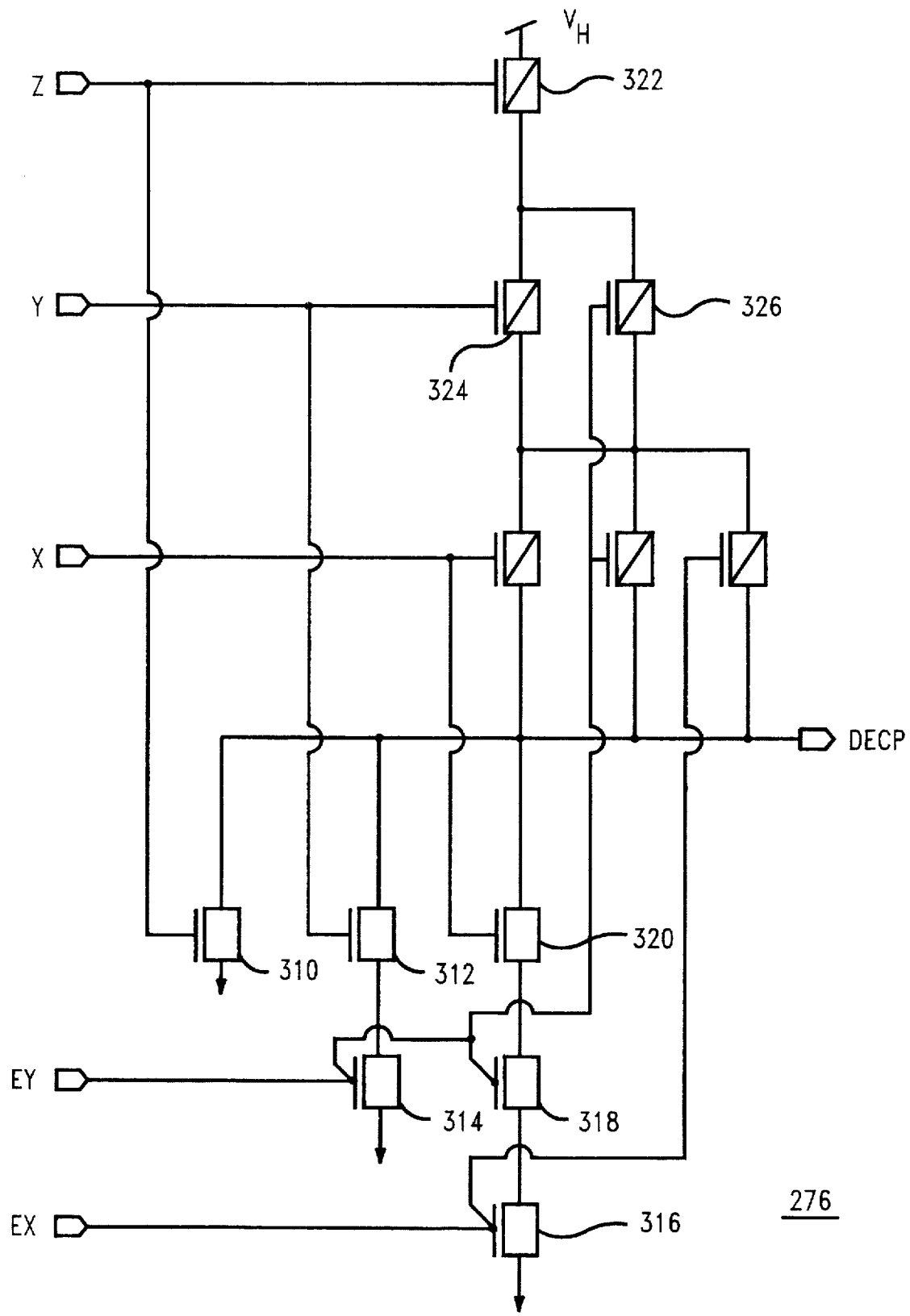
FIG. 10A is a schematic of a final decoder for the shift select circuit of FIG. 8.
Figure 10B:
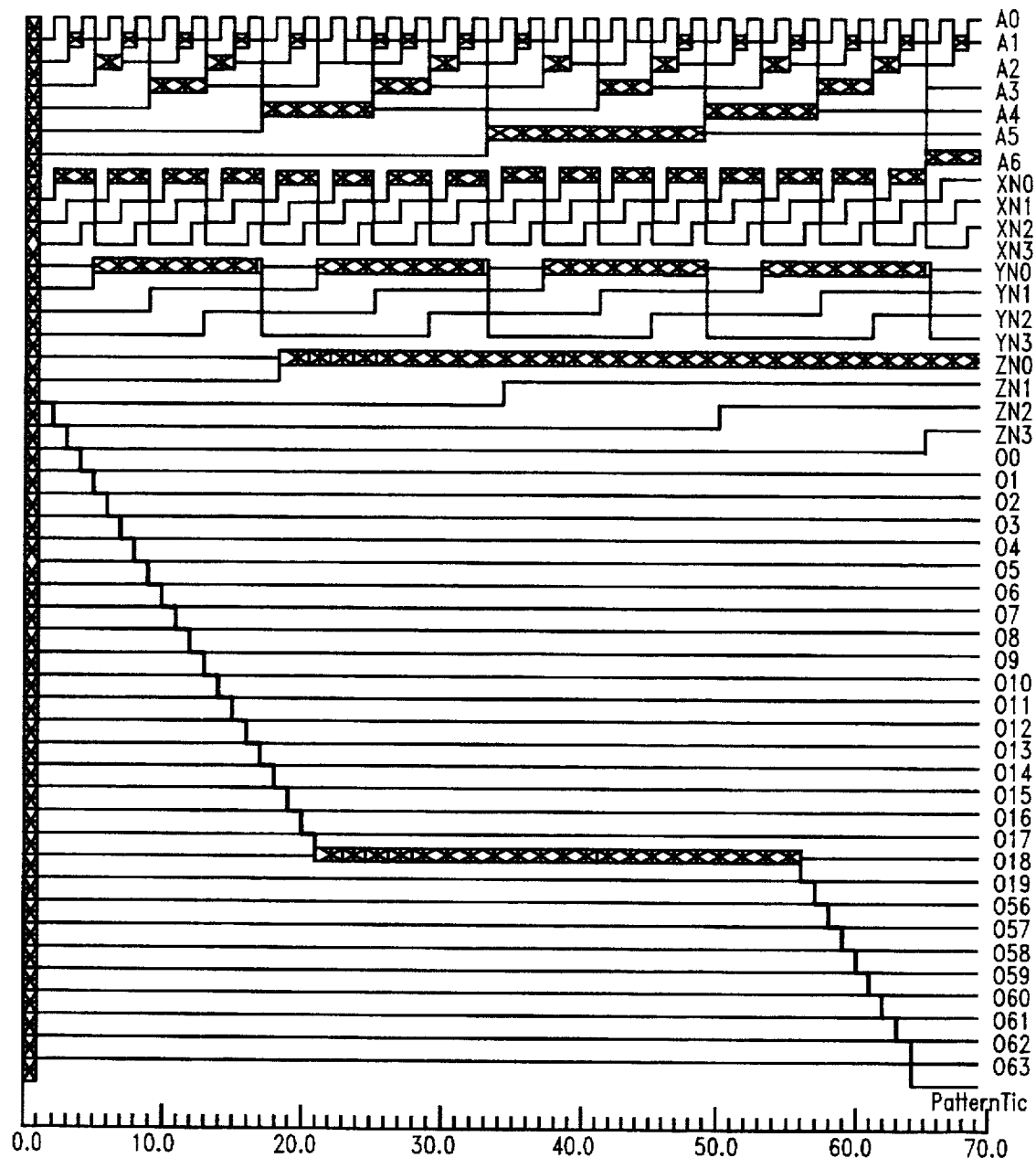
FIG. 10B shows a logic simulation for the pre-decodes and final decoder of the shift select circuit of FIG. 8.

FIG. 10A is a schematic of the Final Decoder 276. FIG. 10B is the logic simulation for the pre-decode and final decodes of the shift select circuit of FIG. 8. The Final decoder 276 has five inputs, an X, Y and Z input and an Enable X (EX) and Enable Y (EY) decoder. NFET 310 connects output DECP to ground when Z is high. NFETs 312, 314 connect DECP to ground when Y and EY are high. NFETs 316, 318 and 320 connect DECP to ground when EX, EY and X are high. PFET 322 isolates DECP from VH when Z is high. PFETs 324, 326 isolate DECP from VH when Y and EY are high. PFETs 328, 330 and 332 isolate DECP from VH when EX, Ey and X are high. Thus, DECP is pulled high if: X, Y and Z are low; EX, Y and Z are low; or EY and Z are low.

So, in FIG. 8, X and Y partial decoders 270, 272, each have their A2 input tied low, guaranteeing that XN3 and YN3 are always low, thus defaulting X and Y partial decoders to a two-input decoder from a three-input decoder. Final decoders 27600–15 have EY tied high enabling their respective Y inputs. Final decoders 27600-3, 276016–19, 276032–35 (not shown) and 276048–51 (not shown) have their EX inputs tied high enabling their respective X inputs. Each Y pre-decoder output YN0–YN3 is a Y input to every fourth group of four final decoders (e.g., 27600–3 and is the EX input to the subsequent group of 4, e.g., 27604–7. Each Z pre-decoder output ZN0–3 is a Z input to a group of 16 final decoders, e.g. 27600–15 and is the EY input to the subsequent group of 16, e.g. 276016–31.

A defective column is identified by the address presented to A0–6. The corresponding final decoder output 00–063 is driven high. Further, every bit to the left of the identified defective bit (i.e. having a lower output number designation has its output driven high. So, a high on the final decoder output shifts the corresponding column 1 position. Further, a second defective column may be identified using an identical decode as in FIG. 8. Thus, a shift from both decoders corresponds to shifting two column positions and a shift from only one decoder corresponds to a single position shift. Whether to shift one, two or no bits may be determined with an Exclusive OR and an AND gate.

Thus, it can be seen from the shift decode logic of FIGS. 8–10 that by coinciding shift decode with bit select decode, there is little or no added delay for selecting a redundant column according to the present invention. Further, because the decoder of FIG. 8 is much more flexible than prior art decoders, the same decoder may be used to select different columns for shifting in different areas of the same RAM.

It can be seen that, for the wide I/O DRAM in the example of FIG. 6, the sparing method of the present invention requires only 2/130=1.5% spare columns dedicated for column redundancy, less than ¼ the 6.25% as in prior art redundancy schemes. In achieving this more than 4× improvement, redundancy decode and logic is simplified. Thus, complex decode circuits, added timing delays or other added logic, normally encountered in trying to compensate for prior art bit line redundancy handicaps are avoided by the present invention. Instead of a complex decoder, a simple one or two bit shift is done with switches (CMOS pass gates). Pass gates add very little delay time to the data path.

Further, the preferred DRAM of the example of FIG. 3A used block dependent redundancy switching in order to minimize device overhead. However, even this redundancy selection requirement may be eliminated by placing fuse programmable switches with each block 170.

Also, with proper design adjustments, the present invention may be applied to word line redundancy, shifting word line addresses one or two lines and ignoring defective lines. The present invention may be applied to bit line redundancy, within a column, shifting bit lines one or two bit lines in either direction. However, some of the efficiency gained in column shifting is lost by applying the present invention to bit line redundancy, not to mention the almost overwhelming loss of chip area resulting from requisite added fuses.

Further, unlike prior art redundancy schemes, the present invention is not limited to RAMs but may be used for any integrated circuits with a bit slice data path. If data path elements are interchangeable, then defective slices may be ignored by shifting the data path one position to either side of the defective element. Therefore, the redundancy selection scheme of the present invention is more flexible, incurs less cell area overhead and provides a significant improvement over prior art redundancy.

While the present invention is described in terms of preferred embodiments, it is understood that numerous variations and modifications will occur to a person skilled in the art without departing in spirit from the claimed invention. It is intended that the scope of the claims include those modifications and variations that fall within the spirit of the invention.

We claim:

1. An integrated circuit chip having a data path at least 4 bytes wide, said integrated circuit chip comprising:

a plurality of arrays, each of said arrays including a plurality of interchangeable elements, said plurality of interchangeable elements being at least one more than the number of bits in said data path and connected to corresponding interchangeable elements of other of said plurality of memory arrays;

selection means for deselecting defective elements;

programming means in each said array for providing said selection means with a defective element location within said array; and switching means for selectively coupling each bit of said data path to a correspond element or, responsive to said selection means, to a corresponding adjacent element.

2. The integrated circuit chip of claim 1 wherein said array is a memory array and said elements are memory elements.

3. The integrated circuit chip of claim 2 wherein said memory elements are memory array columns.

4. The integrated circuit chip of claim 3 wherein said selection means comprises:

a plurality of partial decoders responsive to a defective column address; and, a plurality of final decoders for driving a shift column signal to said defective column signal to said defective column and at each column to one side of said defective column.

5. The integrated circuit chip of claim 1 wherein said switching means is a plurality of three-way switches.

6. The integrated circuit chip of claim 5 wherein each of said three-way switches is three CMOS pass gates.

7. The integrated circuit chip of claim 1 further comprising:

drive means for selectively driving data from said switching means to said array or for passing data from said data path to said switching means.

8. An integrated circuit chip having a data path at least 8 bytes wide and including a RAM, said RAM comprising:

a plurality of memory arrays, each said memory array having a plurality of interchangeable columns, said plurality of interchangeable columns being at least one more than said data path and connected to corresponding columns of other of said plurality of memory arrays;

selection means for deselecting defective columns, said selection means comprising:

a plurality of partial decoders responsive to at least one defective column address, and, a plurality of final decoders for driving responsive to said partial decoders, a shift column signal to said defective column and to each column to one side of each defective column;

programming means in each said memory array for providing said selection means with defective column locations within said array; and switching means for selectively coupling each bit of said data path to a corresponding column or, responsive to said shift column signals, to a corresponding adjacent column.

9. The integrated circuit chip of claim 8 further comprising:

drive means for selectively driving data from said switching means to said data path or for passing data from said data path to said switching means.

10. The integrated circuit chip of claim 9 wherein said switching means is a plurality of three-way switches.

11. The integrated circuit chip of claim 10 wherein each of said plurality of three-way switches is three CMOS pass gates.

12. An integrated circuit chip having a data path at least 8 bytes wide and including a RAM, said RAM including a plurality of memory arrays and comprising:

a plurality of interchangeable columns in each said memory array, said plurality of interchangeable columns being at least one more than said data path and connected to corresponding columns of other of said plurality of memory arrays;

selection means for deselecting defective columns, said selection means comprising:

three partial decoders responsive to at least one defective column address, and a plurality of final decoders for driving, responsive to said partial decoders, a shift column signal to said defective column and to each column to one side of each said defective column, such that columns to one side of a first defective column are shifted one column and columns to the same side of a second defective column are shifted two columns;

programming means for providing said selection means with defective column locations within said each memory array;

switching means comprising a plurality of three-way switches, said switching means for selectively coupling each bit of said data path to a corresponding column or, responsive to said selection means, to a corresponding adjacent column; and drive means for selectively driving data from said switching means to said data path or for passing data from said data path to said switching means.

13. The integrated circuit chip of claim 12 wherein each of said three-way switches is three CMOS pass gates.

* * * * *